United States Patent
Maeto

(10) Patent No.: US 8,130,618 B2
(45) Date of Patent: Mar. 6, 2012

(54) DISK APPARATUS TO WHICH ITERATIVE DECODING IS APPLIED AND METHOD FOR OPERATING LOG LIKELIHOOD RATIOS IN THE SAME

(75) Inventor: Nobuhiro Maeto, Nishitama-gun (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/904,930

(22) Filed: Oct. 14, 2010

(65) Prior Publication Data

US 2011/0188365 A1  Aug. 4, 2011

(30) Foreign Application Priority Data

Feb. 2, 2010 (JP) ................................ 2010-021427

(51) Int. Cl.
*G11B 7/00* (2006.01)
*G11B 5/09* (2006.01)
(52) U.S. Cl. ............... 369/59.22; 369/47.18; 369/53.32; 360/53
(58) Field of Classification Search ............... 369/53.12, 369/53.13, 59.22, 47.18, 53.32, 47.19, 47.2, 369/53.15, 53.34; 360/48, 51, 31, 53
See application file for complete search history.

(56) References Cited

U.S. PATENT DOCUMENTS

| | | | |
|---|---|---|---|
| 6,914,737 B2 | 7/2005 | Taguchi et al. | |
| 7,130,257 B2 | 10/2006 | Taguchi et al. | |
| 7,133,232 B2 | 11/2006 | Taguchi et al. | |
| 7,200,094 B2 * | 4/2007 | Fujimoto et al. | 369/59.22 |
| 7,206,147 B2 | 4/2007 | Taguchi et al. | |
| 7,237,173 B2 | 6/2007 | Morita et al. | |
| 7,287,211 B2 | 10/2007 | Taguchi et al. | |
| 7,576,935 B2 | 8/2009 | Taguchi et al. | |
| 8,015,499 B2 | 9/2011 | Kanaoka | |
| 2003/0043487 A1 | 3/2003 | Morita et al. | |
| 2003/0066020 A1 | 4/2003 | Morita et al. | |
| 2003/0131305 A1 | 7/2003 | Taguchi et al. | |
| 2004/0042369 A1 | 3/2004 | Taguchi et al. | |

(Continued)

FOREIGN PATENT DOCUMENTS

JP    2002-015530    1/2002

(Continued)

OTHER PUBLICATIONS

Notice of Reasons for Rejection mailed by the Japan Patent Office on May 31, 2011 in corresponding Japanese app. No. 2010-021427 in 8 pages.

*Primary Examiner* — Nabil Z Hindi
(74) *Attorney, Agent, or Firm* — Knobbe, Martens, Olson & Bear, LLP

(57) ABSTRACT

According to one embodiment, a method for operating log likelihood ratios in a disk apparatus is disclosed. Iterative decoding is applied to the disk apparatus. The method can set windows for a sequence of the log likelihood ratios output by a soft-decision most-likelihood decoder based on the sequence of the log likelihood ratios or an amplitude of a read signal acquired in response to read of data from a data sector on a disk carried out by a head. The method can multiply the log likelihood ratios contained in each of the windows, by a multiplier specific to each window. In addition, the method can transmit the sequence of the log likelihood ratios multiplied by the multiplier for each of the windows to a parity check decoder.

10 Claims, 11 Drawing Sheets

U.S. PATENT DOCUMENTS

| | | |
|---|---|---|
| 2004/0071069 A1 | 4/2004 | Taguchi et al. |
| 2005/0120286 A1 | 6/2005 | Akamatsu |
| 2005/0185314 A1 | 8/2005 | Taguchi et al. |
| 2005/0190477 A1 | 9/2005 | Taguchi et al. |
| 2005/0195923 A1 | 9/2005 | Taguchi et al. |
| 2008/0104460 A1 | 5/2008 | Kanaoka |
| 2008/0104486 A1 | 5/2008 | Kanaoka |
| 2008/0263430 A1 | 10/2008 | Taguchi et al. |

FOREIGN PATENT DOCUMENTS

| | | |
|---|---|---|
| JP | 2003-068024 | 3/2003 |
| JP | 2003-203435 | 7/2003 |
| JP | 2004-086994 | 3/2004 |
| JP | 2005-166089 | 6/2005 |
| JP | 2008-112516 | 5/2008 |
| JP | 2008-112527 | 5/2008 |

\* cited by examiner

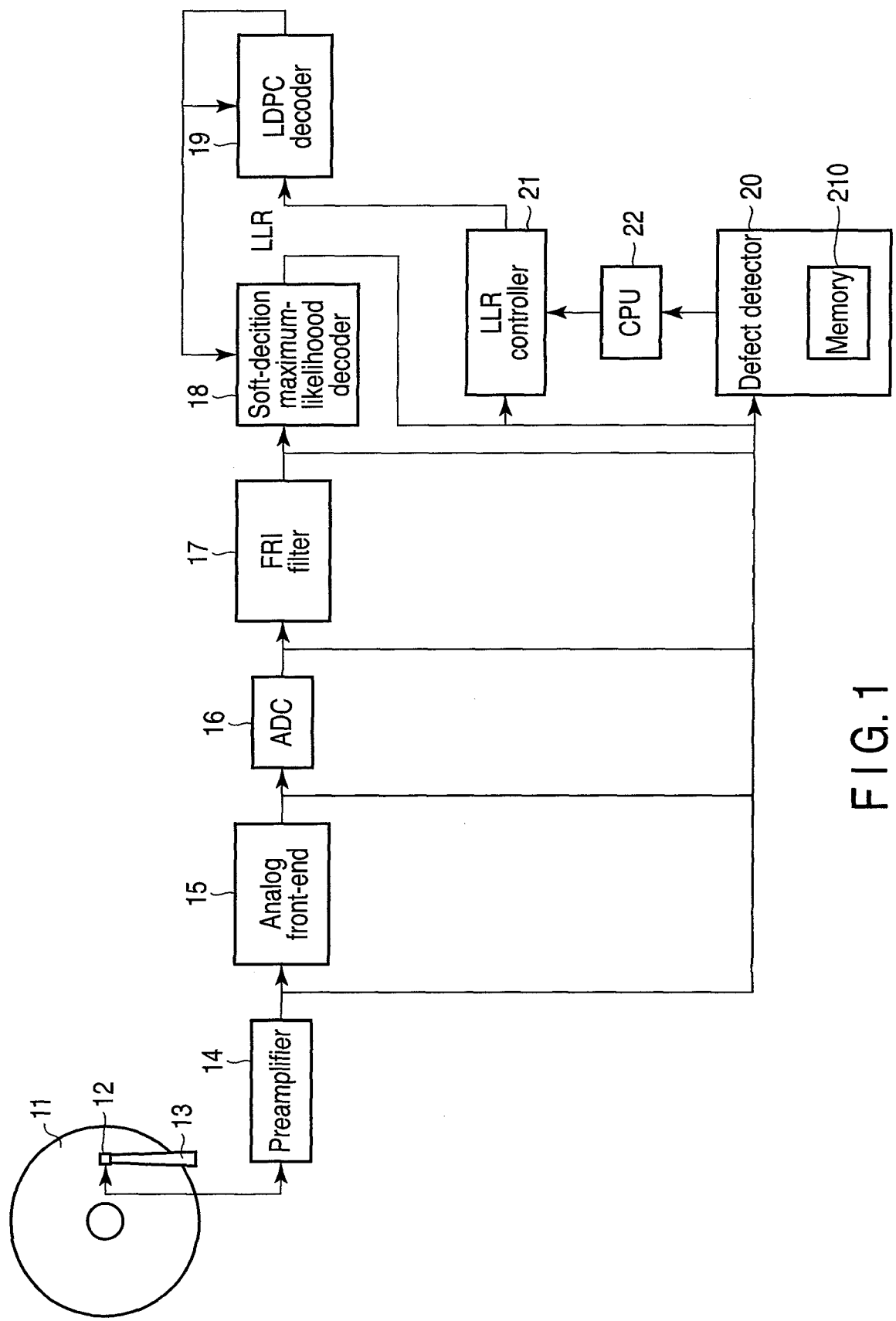
F I G. 1

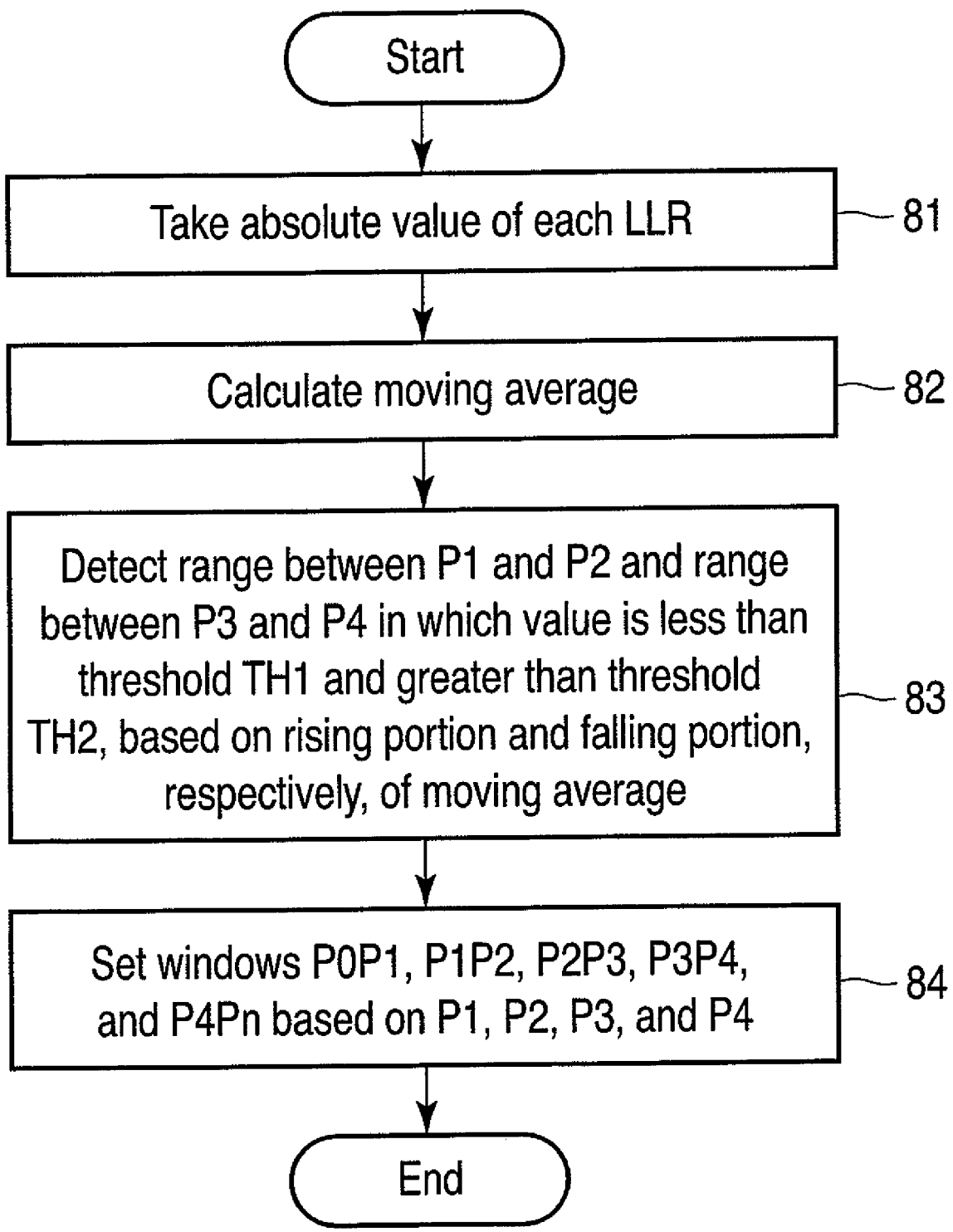
F I G. 8

DISK APPARATUS TO WHICH ITERATIVE DECODING IS APPLIED AND METHOD FOR OPERATING LOG LIKELIHOOD RATIOS IN THE SAME

CROSS-REFERENCE TO RELATED APPLICATIONS

This application is based upon and claims the benefit of priority from Japanese Patent Application No. 2010-021427, filed Feb. 2, 2010; the entire contents of which are incorporated herein by reference.

FIELD

Embodiments described herein relate generally to a disk apparatus to which iterative decoding is applied and a method for operating log likelihood ratios in the disk apparatus.

BACKGROUND

In some recently developed disk apparatuses to which iterative decoding is applied, a low density parity check (LDPC) code is used as a parity check code added to data written to a disk. In these disk apparatuses, each bit of data read from the disk is decoded by an LDPC decoder based on a log likelihood ratio (LLR) output by a soft-decision maximum-likelihood decoder. A soft output Viterbi algorithm (SOVA) is applied to the soft-decision maximum-likelihood decoder.

LLR is a logarithmic form of the ratio of the probability (likelihood) that the corresponding bit is "1" to the probability that the bit is "0". When positive, LLR indicates that the corresponding bit is more likely to be "1". When negative, LLR indicates that the corresponding bit is more likely to be "0". When LLR is zero, the corresponding bit can be determined to be "1" or "0" at the same probability. That is, when LLR is zero, the corresponding bit is least reliable. Thus, LLR is reliability (probability) data indicative of the degree of reliability (probability) at which the corresponding bit is "1" or "0".

The LDPC decoder carries out parity check based on LDPC code added to data corresponding to LLRs output by the soft-decision maximum-likelihood decoder, to update LLRs. Based on updated LLRs, the soft-decision maximum-likelihood decoder outputs new LLRs. Thus, LLRs are repeatedly propagated between the soft-decision maximum-likelihood decoder and the LDPC decoder under a predetermined condition. The propagation of LLRs is called probability propagation. Data is decoded by iteration of propagation of LLRs, that is, iterative decoding.

It is assumed that LLRs are partly low in a certain portion of the data because of a defect on a disk. The presence of such a portion may affect the other, higher LLRs owing to probability propagation.

Thus, for example, Jpn. Pat. Appln. KOKAI Publication No. 2008-112527 (hereinafter referred to as the prior art document) discloses a technique to mask the part of LLRs corresponding to a defective portion (hereinafter referred to as a medium defective portion) on the disk based on the above-described LLRs or the amplitude of a signal (read signal) read from the disk by a head. The technique described in the prior art document uses a scaling factor α to reduce the part of LLRs corresponding to the medium defective portion, thus suppressing the adverse effect of propagation of the part of LLRs corresponding to the medium defective portion.

The medium defective portion is roughly classified into a medium defective portion associated with a sharp decrease in the amplitude of the read signal (this type is hereinafter referred to as a first medium defective portion) and a medium defective portion associated with a gradual decrease in the amplitude of the read signal (this type is hereinafter referred to as a second medium defective portion). At the boundary of the first medium defective portion, the amplitude of the read signal or LLRs decrease or increase rapidly. Thus, the boundary of the first medium defective portion can be accurately detected based on the amplitude of the read signal (for example, the moving average of the amplitude) or LLRs.

In contrast, it is difficult to accurately detect the boundary of the second medium defective portion based on the amplitude of the read signal or LLRs. Furthermore, even if the boundary of the second medium defective portion is successfully detected, data is not always successfully read from a data sector with the second medium defective portion. Thus, there has been a demand to effectively control the adverse effect of the second medium defective portion on normal portions.

BRIEF DESCRIPTION OF THE DRAWINGS

A general architecture that implements the various feature of the embodiments will now be described with reference to the drawings. The drawings and the associated descriptions are provided to illustrate the embodiments and not to limit the scope of the invention.

FIG. 1 is a block diagram showing the exemplary configuration of a magnetic disk drive according to an embodiment;

FIG. 8 is a flowchart showing the exemplary procedure of window setting applied to the embodiment;

DETAILED DESCRIPTION

Figure 2:
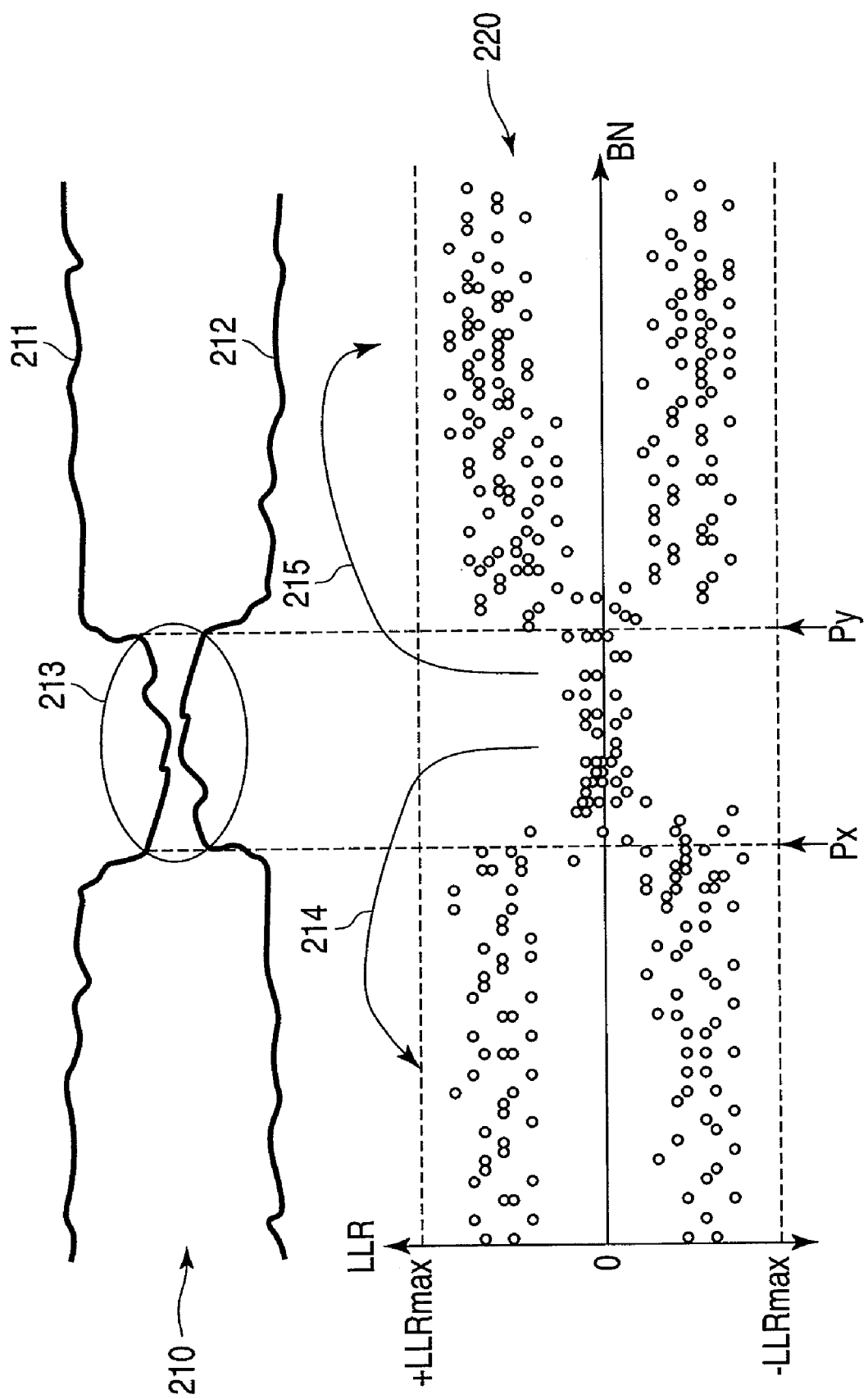
FIG. 2 is a diagram showing a first example of a defective portion present on a data sector, by means of an envelope for a read signal and a log likelihood ratio distribution corresponding to the read signal.

Various embodiments will be described hereinafter with reference to the accompanying drawings. In general, according to one embodiment, a method for operating log likelihood ratios in a disk apparatus is disclosed. Iterative decoding is applied to the disk apparatus. The method can set windows for a sequence of the log likelihood ratios output by a soft-decision most-likelihood decoder based on the sequence of the log likelihood ratios or an amplitude of a read signal acquired in response to read of data from a data sector on a disk carried out by a head. The method can multiply the log likelihood ratios contained in each of the windows, by a multiplier specific to each window. In addition, the method can transmit the sequence of the log likelihood ratios multiplied by the multiplier for each of the windows to a parity check decoder.

FIG. 1 is a block diagram showing the configuration of a magnetic disk drive (HDD) according to an embodiment. In FIG. 1, a disk (magnetic disk) is spun at a high speed by a spindle motor (not shown in the drawings). A head 12 is located over a recording surface of the disk 11. The head 12 is used to write and read data to and from the disk 11. The head 12 is attached to the leading end of an actuator 13. The head 12 flies over the disk as a result of high-speed spinning of the disk 11. The actuator 13 is driven by a voice coil motor (not shown in the drawings) to move the head 12 in the radial direction of the disk 11.

In the embodiment, a low density parity check (LDPC) code is added, as a parity check code, to data written to a data sector on the disk by the head 12. The data written to the data sector (more specifically, the target data sector) on the disk 11 is read by the head 12. Then, the head 12 outputs a read signal. The read signal is amplified by a preamplifier 14.

The read signal amplified by the preamplifier 14 is transferred to an analog-to-digital converter (ADC) 16 via an analog front-end (analog front-end circuit) 15. The analog front-end 15 includes a variable gain amplifier (VGA) and an analog filter. The analog-to-digital converter 16 converts the read signal into a sequence of digital data at a predetermined sampling period. The sequence of digital data output by the analog-to-digital converter 16 is equalized into a target partial response (PR) waveform by, for example, a finite impulse response (FIR) filter 17 serving as a digital equalizer.

The sequence of the digital data (more specifically, code data) equalized by the FIR filter 17 (PR equalization) is input to a soft-decision maximum-likelihood decoder 18. Based on a soft output Viterbi algorithm (SOVA), the soft-decision maximum-likelihood decoder 18 outputs a sequence of log likelihood ratios (LLRs) from the sequence of the digital data. As described above, when positive, each of LLRs indicates that the corresponding bit is more likely to be "1". When negative, each of LLRs indicates that the corresponding bit is more likely to be "0". When each of LLRs is zero, the corresponding bit can be determined to be "1" or "0" at the same probability. The maximum value of each positive LLR is expressed as +LLRmax. One of negative LLRs with the maximum absolute value is expressed as −LLRmax.

The sequence of LLRs output by the soft-decision most-likelihood decoder 18 is input to an LLR controller 21. The LLR controller 21 normally outputs the sequence of LLRs output by the soft-decision most-likelihood decoder 18, to an LDPC decoder 19 without performing any special operation on the sequence. That is, the sequence of LLRs output by the soft-decision most-likelihood decoder 18 is transferred to the LDPC decoder 19 through the LLR controller 21.

Furthermore, in an LLR operation mode, the LLR controller 21 performs a product operation (multiplication) on the first sequence of LLRs output by the soft-decision most-likelihood decoder 18 in response to read of data from the data sector carried out by the head 12. In the embodiment, as described later, LLRs contained in each of windows set by a defect detector 20 are multiplied by a multiplier (or a multiplier factor) specific to the window. The sequence of LLRs multiplied by the multiplier (hereinafter referred to as the operation multiplier) is transferred to the LDPC decoder 19. The setting of the LLR operation mode will be described below.

The LDPC decoder 19 carries out parity check based on the LDPC code added to the data corresponding to the sequence of LLRs transferred by the LLR controller 21. The LDPC decoder 19 thus updates each LLR in the sequence. The LDPC decoder 19 outputs the sequence of the updated LLRs to the soft-decision maximum-likelihood decoder 18.

With the sequence of LLRs directly or indirectly propagated between the soft-decision most-likelihood decoder 18 and the LDPC decoder 19 as described above, the operation is reiterated under a predetermined condition. Based on each LLR in the sequence of LLRs resulting from completion of the iterative operations, the LDPC decoder 19 decodes a sequence of hard decision values, that is, a sequence of binary data. The LDPC decoder 19 carries out parity check on all the codes for the decoded binary data. If as a result of the parity check, the parity is satisfied for all the codes, this means that the decoding has finished normally. On the other hand, if as a result of the parity check, any one of the codes fails to satisfy the parity, a read error has occurred. In this case, a retry to read data from the target data sector (that is, a read retry) is carried out.

The read retry is carried out up to a predetermined number of times N until the data read succeeds. In the embodiment, given that M is a natural number less than N, for example, after shipment of HDD, if the data read fails consecutively even with M iterated read retries, CPU 22 described below sets an LLR operation mode. The LLR operation mode is also set if during the process of manufacturing HDD, more specifically, during the process of detecting a defective sector on the disk 11, a defective portion on any data sector is detected by the defect detector 20.

Figure 3:
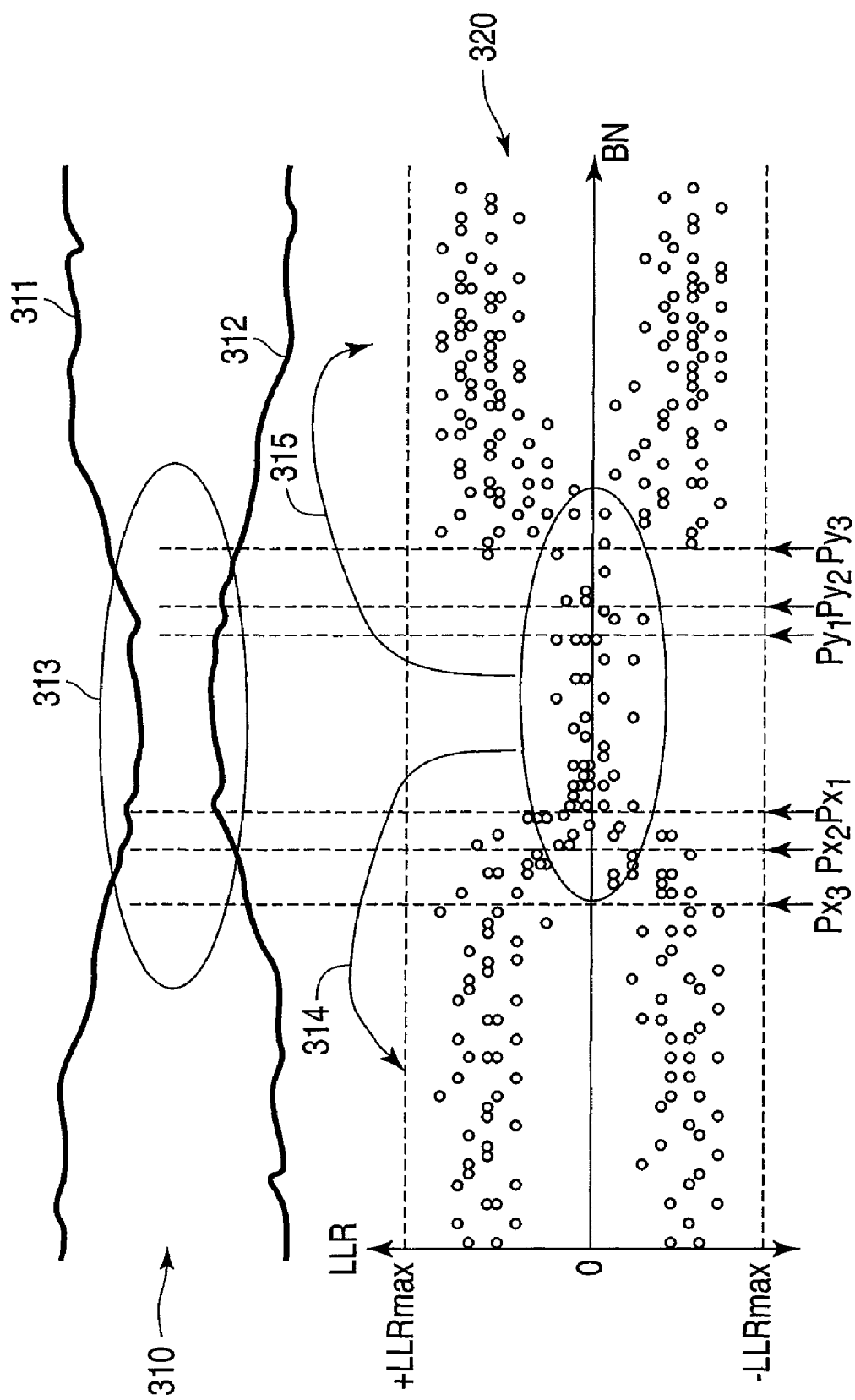
FIG. 3 is a diagram showing a second example of a defective portion present on a data sector, by means of an envelope for a read signal and a log likelihood ratio distribution corresponding to the read signal.

Here, it is assumed that a defective portion (medium defective portion) is present on the target data sector. In this case, LLRs corresponding to the defective portion are propagated between the soft-decision most-likelihood decoder 18 and the LDPC decoder 19. This may affect LLRs corresponding to the other, normal portions. FIGS. 2 and 3 show a first and a second examples of defective portions present on the data sector, by means of an envelope for the read signal and an LLR distribution corresponding to the read signal.

In FIG. 2, reference number 210 denotes an envelope of the read signal obtained when data is read from the data sector by the head 12. Reference number 220 denotes an LLR distribution for the LLR sequence corresponding to the read signal. The envelope 210 for the read signal shows an envelope 211 corresponding to the positive maximum amplitude of the read signal and an envelope 212 corresponding to the negative maximum amplitude of the read signal. The x axis for the LLR distribution 220 indicates a bit number (sample point number) BN. The y axis for the LLR distribution 220 indicates the value of LLR. Arrows 214 and 215 on the LLR distribution 220 indicate that LLRs corresponding to the defective portion 213 affect LLRs corresponding to other, normal portions as a result of propagation.

In the example in FIG. 2, the amplitude of the read signal decreases sharply at the boundary of the defective portion 213 enclosed by an ellipse. That is, the defective portion 213 corresponds to the above-described first medium defective portion. In the LLR distribution 220, the values of LLRs corresponding to the defective portion 213 concentrate in the vicinity of zero (0) unlike in the case of LLRs corresponding to the other, normal portions. In this case, a read success rate is low in the LDPC decoder 19. Thus, this type of data sector is likely to be detected to be defective during the process of manufacturing HDD, and is thus nonproblematic.

Furthermore, the amplitude of the read signal or LLRs increase or decrease rapidly at the boundaries Px and Py of the defective portion 213. Thus, even by a well-known technique for detecting a defective portion based on the amplitude of the read signal (for example, the moving average of the amplitude) or LLRs, the boundaries Px and Py of the defective portion 213 can be accurately detected. Thus, a window for masking LLRs present between Px and Py can be set.

In FIG. 3, reference number 310 denotes an envelope for the read signal obtained when data is read from the data sector by the head 12. Reference number 320 denotes an LLR distribution for the LLR sequence corresponding to the read signal. The envelope 310 for the read signal shows an envelope 311 corresponding to the positive maximum amplitude of the read signal and an envelope 312 corresponding to the negative maximum amplitude of the read signal. Arrows 314 and 315 indicate that LLRs corresponding to a defective portion 313 affect LLRs corresponding to other, normal portions as a result of propagation.

In the example in FIG. 3, the amplitude of the read signal decreases gradually at the boundary of the defective portion 313 enclosed by an ellipse. In the LLR distribution, the values of LLRs corresponding to the defective portion 313 vary widely between 0 and the level of LLRs corresponding to the other, normal portions. In such an example as shown in FIG. 3, it is difficult to detect the boundary of the defective portion 313 based on the amplitude of the read signal (for example, the moving average of the amplitude) or LLRs. For example, a pair of Px1 and Py1, a pair of Px2 and Py2, or a pair of Px3 and Py3 shown in FIG. 3 may be detected to be the boundary of the defective portion 313. If the boundary of the defective portion 313 is incorrectly detected, LLRs may be masked even for bits with effective LLRs or LLRs to be masked may fail to be masked. In such a case, the rate of bit errors BER in data reads from the data sector with the defective portion 313 may increase.

Furthermore, even if the boundary of the defective portion 313 is successfully detected, read of data from the data sector with the defective portion 313 is not always successful. Moreover, the read success rate for the data sector with the defective portion 313 is likely to be affected by a small variation in amplitude caused by a variation in write quality and temperature environment. Hence, the read success rate varies significantly depending on the depth of the defective portion 313. Thus, the data sector with the defective portion 313 is likely to fail to be detected to be defective during the manufacturing process.

Thus, HDD according to the embodiment is configured to be capable of preventing LLRs corresponding to the defective portion 313 of the type shown in FIG. 3 from affecting LLRs corresponding to the other, normal portions after shipment of HDD. This configuration enables the data sector with the defective portion 313 to be detected to be defective during the process of manufacturing HDD as described below.

The embodiment will be described in further detail with reference again to FIG. 1. The defect detector 20 detects a defective portion (medium defective portion) on a data sector on the disk 11 based on an output from the preamplifier 14, an output from the analog front-end 15, an output from the analog-to-digital converter 16, an output from the FIR filter 17, or the first output from the soft-decision most-likelihood decoder 18; all the outputs are provided in response to the read of data from the data sector carried out by the head 12. Here, if the output from the preamplifier 14 or the output from the analog front-end 15 is used to detect the defective portion, the defect detector 20 need to comprise an analog-to-digital converter configured to convert the output from the preamplifier 14 or the output from the analog front-end 15 into digital data at a predetermined sampling period.

The defect detector 20 comprises a memory 210. The memory 210 is used to temporarily store a sequence of digital data output by the analog-to-digital converter provided in the defect detector 20, a sequence of digital data output by the analog-to-digital converter 16, a sequence of digital data output by the FIR filter 17 and having an equalized waveform, or the first sequence of LLRs output by the soft-decision most-likelihood decoder 18, in response to the read of data from a data sector.

The defect detector 20 classifies the sequence of digital data or sequence of LLRs stored in the memory 210 into levels set based on at least one threshold. Based on this classification (that is, the level classifying), the defect detector 20 sets the windows at corresponding different positions in the data sector in association with the sequence of LLRs. Here, the sequence of digital data corresponds to the amplitude of the read signal. That is, the defect detector 20 sets the windows based on the amplitude of the read signal or the sequence of LLRs and the at least one threshold. Here, the window corresponding to the lowest level corresponds to the defective portion of the data sector. The window corresponding to the highest level corresponds to the normal portion of the data sector. The defect detector 20 also determines, for each window, the operation multiplier to be applied to the product operation for LLRs output by the soft-decision most-likelihood decoder 18 and contained in each of the windows.

In the LLR operation mode, the LLR controller 21 multiplies the first LLRs output by the soft-decision most-likelihood decoder 18 and contained in each of the windows set by the defect detector 20, by the operation multiplier which is specific to the window and which is determined by the defect detector 20. The LLR controller 21 transfers the sequence of LLRs multiplied by the multiplier for each of the windows to the LDPC decoder 19.

CPU 22 functions as a main controller configured to control HDD as a whole. In particular, in the embodiment, CPU 22 functions as an interface between the defect detector 20 and the LLR controller 21. That is, CPU 22 instructs the LLR controller 21 to perform the product operation using the multiplier which is specific to each of the windows and which is determined by the defect detector 20 in accordance with the setting of the windows carried out by the defect detector 20. CPU 22 may be allowed to carry out at least one of the defect detection, window setting, and determination of the operation multiplier for each window.

Figure 4:
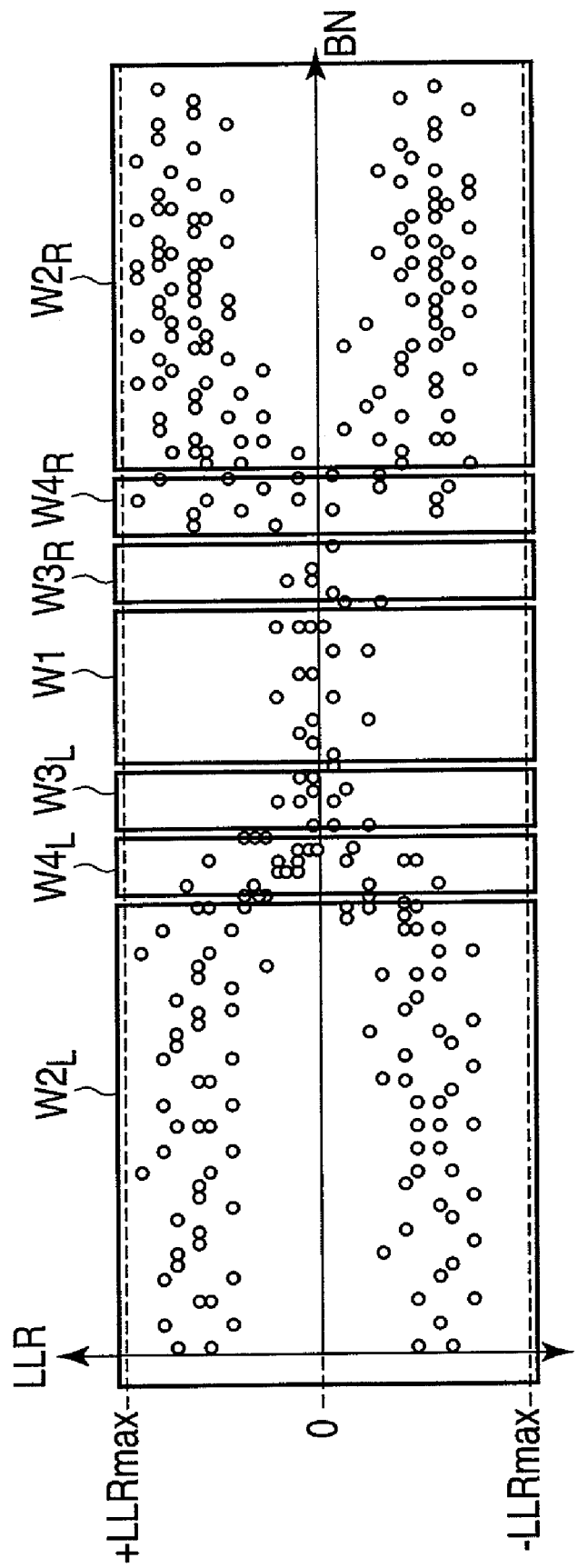
FIG. 4 is a diagram showing an example of windows and a log likelihood ratio distribution for the sequence of log likelihood ratios corresponding to a data sector.

Now, with reference to FIGS. 4 to 6, operations will be described which are performed by the defect detector 20 and the LLR controller 21 when the defect detector 20 sets seven windows. FIG. 4 shows an example of windows and an LLR distribution for a sequence of LLRs corresponding to a data sector. In FIG. 4, seven windows W1, $W2_L$, $W2_R$, $W3_L$, $W3_R$, $W4_L$, and $W4_R$ are set by the defect detector 20 based on the sequence of LLRs corresponding to the data sector. In the example in FIG. 4, the sequence of LLRs corresponding to the data sector is classified into four levels.

Window (first window) W1 corresponds to the lowest level. Windows (second windows) $W2_L$ and $W2_R$ correspond to the highest level. That is, window W1 corresponds to a defective portion of the data sector. Windows $W2_L$ and $W2_R$ correspond to normal portions of the data sector. Windows (third windows) W3$_L$ and W3$_R$ correspond to a level higher than and next to the lowest one. Windows (fourth windows) W4$_L$ and W4$_R$ correspond to a level lower than and next to the highest one. That is, windows W3$_L$ and W3$_R$ correspond to a defective portion side of the boundary (transition) portion between the defective portion and the normal portion and are set closer to window W1. On the other hand, windows W4$_L$ and W4$_R$ correspond to a normal portion side of the boundary portion between the defective portion and the normal portion and are set closer to windows W2$_L$ and W2$_R$, respectively.

Figure 5:
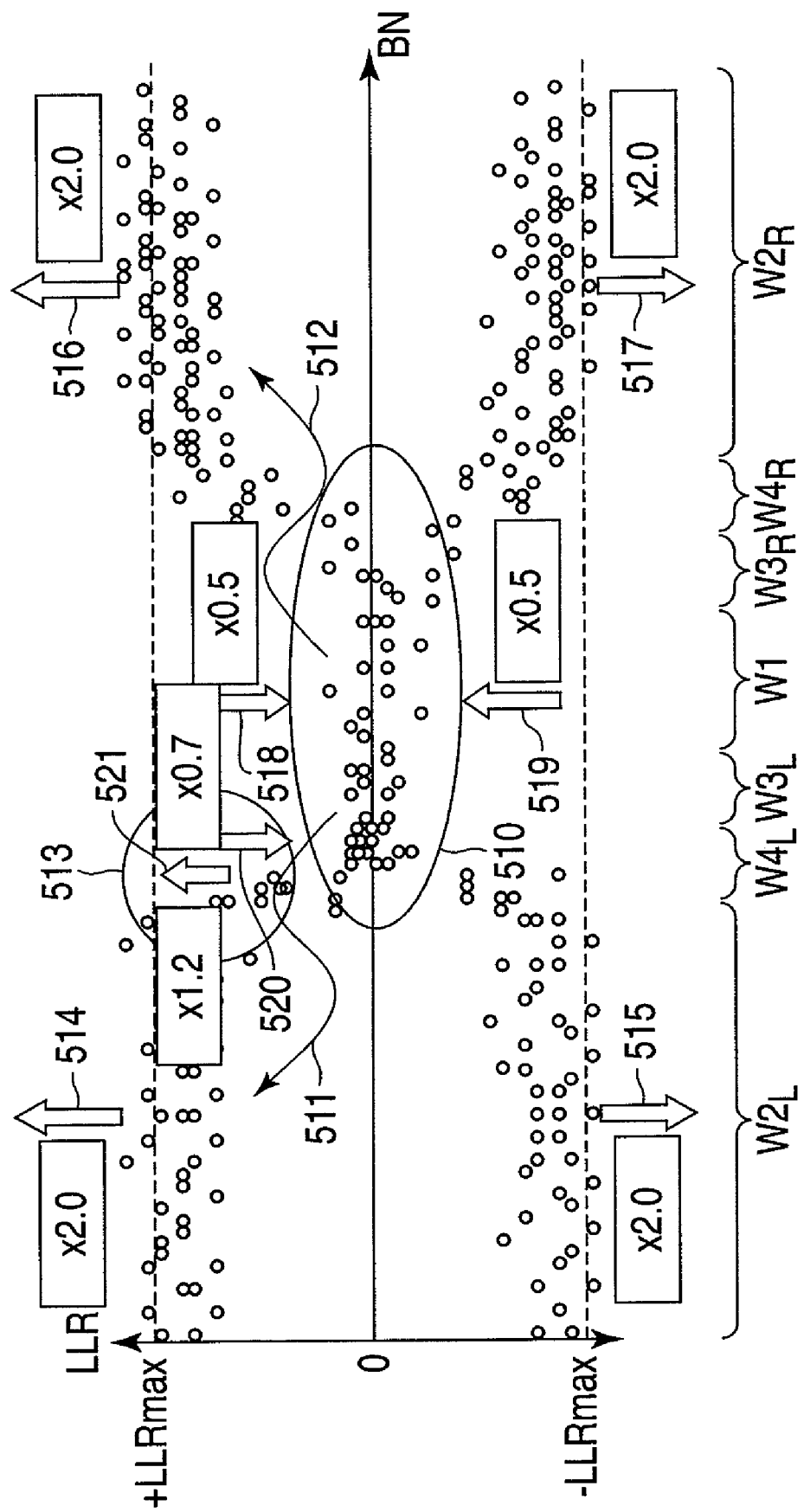
FIG. 5 is a diagram showing an operation multiplier applied to each of windows after shipment of a magnetic disk drive, together with a log likelihood ratio distribution, according to the embodiment.
Figure 6:
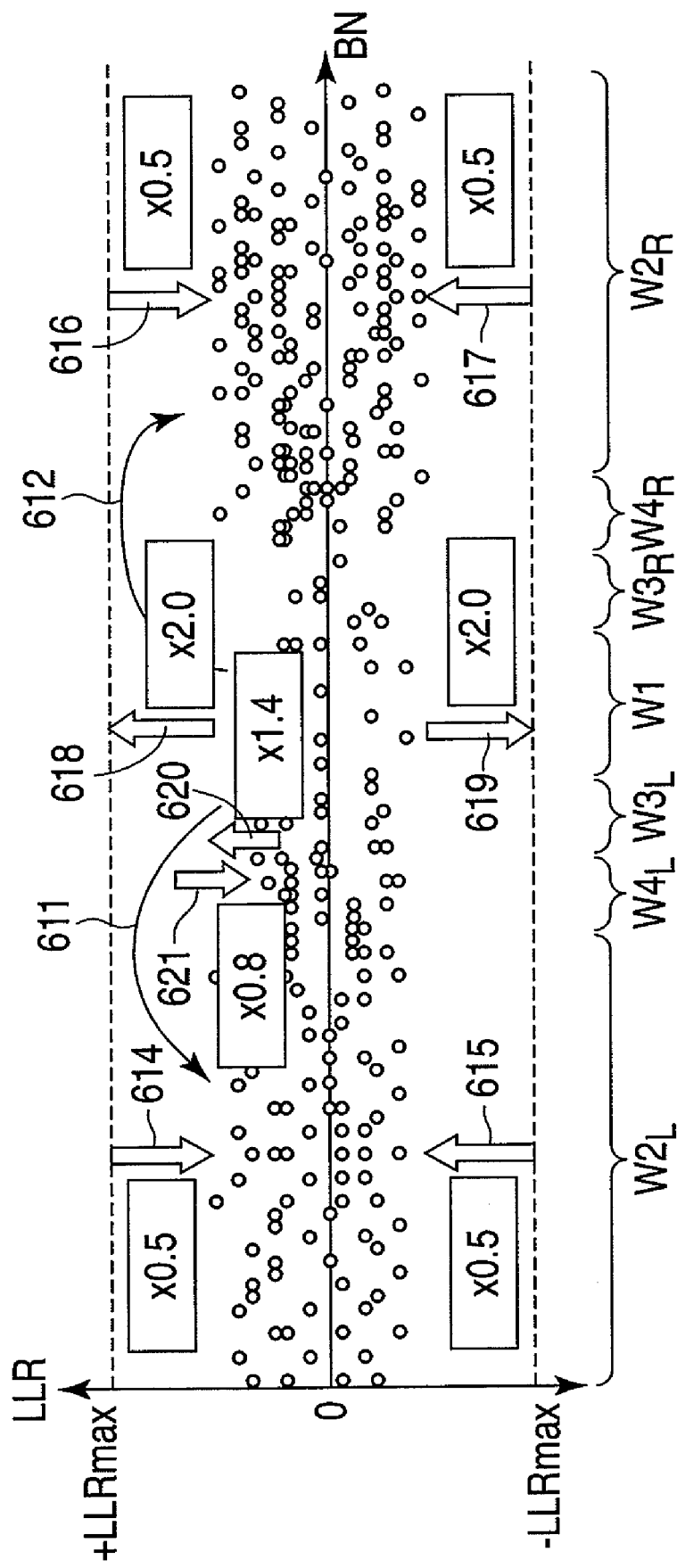
FIG. 6 is a diagram showing an operation multiplier applied to each of windows during a manufacturing process for the magnetic disk drive, together with a log likelihood ratio distribution, according to the embodiment.

FIGS. 5 and 6 show an operation multiplier applied to each of the windows in the example of the LLR distribution and windows shown in FIG. 4. FIGS. 5 and 6 also show the LLR distribution. FIG. 5 shows an example of an operation multiplier applied to each of the windows after shipment of HDD according to the embodiment. FIG. 6 shows an example of an operation multiplier applied to each of the windows during the process of manufacturing HDD.

LLR operation applied to each of the windows after shipment of HDD according to the embodiment will be described with reference to FIG. 5. As shown in FIG. 5, the LLR controller 21 multiplies each of LLRs in window W1, corresponding to the lowest level (defective portion 510), by a predetermined operation multiplier (minimum multiplier or first multiplier) less than 1, for example, 0.5. Thus, the values of LLRs corresponding to the defective portion 510 are changed to directions shown by arrows 518 and 519 in FIG. 5, that is, to the directions in which the absolute values of LLRs decrease.

Furthermore, the LLR controller 21 multiplies each of LLRs in windows W2$_L$ and W2$_R$, corresponding to the highest level (normal portion), by a predetermined operation multiplier (maximum multiplier or second multiplier) greater than 1, for example, 2.0. Thus, the values of LLRs corresponding to the normal portion are changed to directions shown by arrows 514 to 517 in FIG. 5, that is, to the directions in which the absolute values increase.

Thus, after shipment of HDD, the values of LLRs corresponding to the defective portion 510 are reduced, whereas the values of LLRs corresponding to the normal portion are increased. This relatively reduces the adverse effect of LLRs corresponding to the defective portion 510 on LLRs corresponding to the normal portion as shown by arrows 511 and 512 in FIG. 5. As a result, the bit error rate BER for the read of data from the data sector with the defective portion 510 can be improved.

Furthermore, the LLR controller 21 multiplies each of LLRs in window W3$_L$ corresponding to the defective portion side of the boundary 513 between the defective portion 510 and the normal portion, by an operation multiplier (third multiplier) less than 1 and greater than or equal to the minimum multiplier (0.5), for example, 0.7. Thus, the values of LLRs corresponding to the defective portion side of the boundary 513 between the defective portion 510 and the normal portion are changed to a direction shown by arrow 520 in FIG. 5, that is, the direction in which the absolute values decrease. Although not shown in FIG. 5, the LLR controller 21 also multiplies each of LLRs in window W3$_R$ by, for example, 0.7.

Furthermore, the LLR controller 21 multiplies each of LLRs in window W4L corresponding to the normal portion side of the boundary 513 between the defective portion 510 and the normal portion, by an operation multiplier (fourth multiplier) greater than 1 and less than or equal to the maximum multiplier (2.0), for example, 1.2. Thus, the values of LLRs corresponding to the normal portion side of the boundary 513 between the defective portion 510 and the normal portion are changed to a direction shown by arrow 519 in FIG. 5, that is, the direction in which the absolute values increase. Although not shown in FIG. 5, the LLR controller 21 also multiplies each of LLRs in window W4$_R$ by, for example, 1.2.

As described above, after shipment of HDD, the LLR controller 21 reduces the values of not only LLRs corresponding to the defective portion 510 but also LLRs corresponding to the defective portion side of the boundary between the defective portion 510 and the normal portion, while increasing the values of not only LLRs corresponding to the normal portion but also LLRs corresponding to the normal portion side of the boundary. Thus, the adverse effect of LLRs corresponding to the defective portion 510 on LLRs corresponding to the normal portion can be relatively reduced.

LLR operation applied to each of the windows during the process of manufacturing HDD according to the embodiment will be described with reference to FIG. 6. As shown in FIG. 6, the LLR controller 21 multiplies each of LLRs in window W1 corresponding to the lowest level (defective portion) by a predetermined operation multiplier (maximum multiplier or first multiplier) greater than 1, for example, 2.0. Thus, the values of LLRs corresponding to the defective portion are changed to directions shown by arrows 618 and 619 in FIG. 6, that is, the directions in which the absolute values increase.

Furthermore, the LLR controller 21 multiplies each of LLRs in windows W2$_L$ and W2$_R$ corresponding to the highest level (normal portion) by a predetermined operation multiplier (minimum multiplier or second multiplier) less than 1, for example, 0.5. Thus, the values of LLRs corresponding to the normal portion are changed to directions shown by arrows 614 to 617 in FIG. 6, that is, the directions in which the absolute values decrease.

As described above, during the process of manufacturing HDD, the LLR controller 21 increases the values of LLRs corresponding to the defective portion, while reducing the values of LLRs corresponding to the normal portion. Thus, the adverse effect of LLRs corresponding to the defective portion on LLRs corresponding to the normal portion as shown by arrows 611 and 612 in FIG. 6 can be relatively increased. As a result, the bit error rate BER for read of data from a data sector with such a defective portion can be deteriorated, enabling the data sector with the defective portion to be reliably detected to be defective.

Furthermore, the LLR controller 21 multiplies each of LLRs in window W3$_L$ corresponding to the defective portion side of the boundary between the defective portion and the normal portion, by an operation multiplier (third multiplier) greater than 1 and less than or equal to the maximum multiplier (2.0), for example, 1.4. Thus, the values of LLRs corresponding to the defective portion side of the boundary between the defective portion and the normal portion are changed to a direction shown by arrow 620 in FIG. 6, that is, the direction in which the absolute values increase. Although not shown in FIG. 6, the LLR controller 21 also multiplies each of LLRs in window W3$_R$ by, for example, 1.4.

Furthermore, the LLR controller 21 multiplies each of LLRs in window W4$_L$ corresponding to the normal portion side of the boundary between the defective portion and the normal portion, by an operation multiplier (fourth multiplier) less than 1 and greater than or equal to the minimum multiplier (0.5), for example, 0.8. Thus, the values of LLRs corresponding to the normal portion side of the boundary between the defective portion and the normal portion are changed to a direction shown by arrow 619 in FIG. 6, that is, the direction in which the absolute values decrease. Although not shown in FIG. 6, the LLR controller 21 also multiplies each of LLRs in window W4$_R$ by, for example, 0.8.

As described above, during the process of manufacturing HDD, the LLR controller 21 increases the values of not only LLRs corresponding to the defective portion but also LLRs corresponding to the defective portion side of the boundary between the defective portion and the normal portion, while decreasing the values of not only LLRs corresponding to the normal portion but also LLRs corresponding to the normal portion side of the boundary. Thus, the adverse effect of LLRs corresponding to the defective portion on LLRs corresponding to the normal portion can be relatively increased. As a result, the data sector with the defective portion can be more reliably detected to be defective.

Thus, according to the embodiment, the sequence of LLRs is classified into a plurality of levels based on or the sequence of LLRs or the amplitude of a read signal acquired in response to read of data from the data sector on the disk carried out by the head. Then, the windows corresponding to the respective levels are set for the sequence of LLRs. The product operation using the operation multiplier for each window is performed on LLRs contained in each of the set windows. Thus, the effect of LLRs corresponding to the defective portion on the data sector on LLRs corresponding to the normal portion can be effectively controlled.

Figure 7:
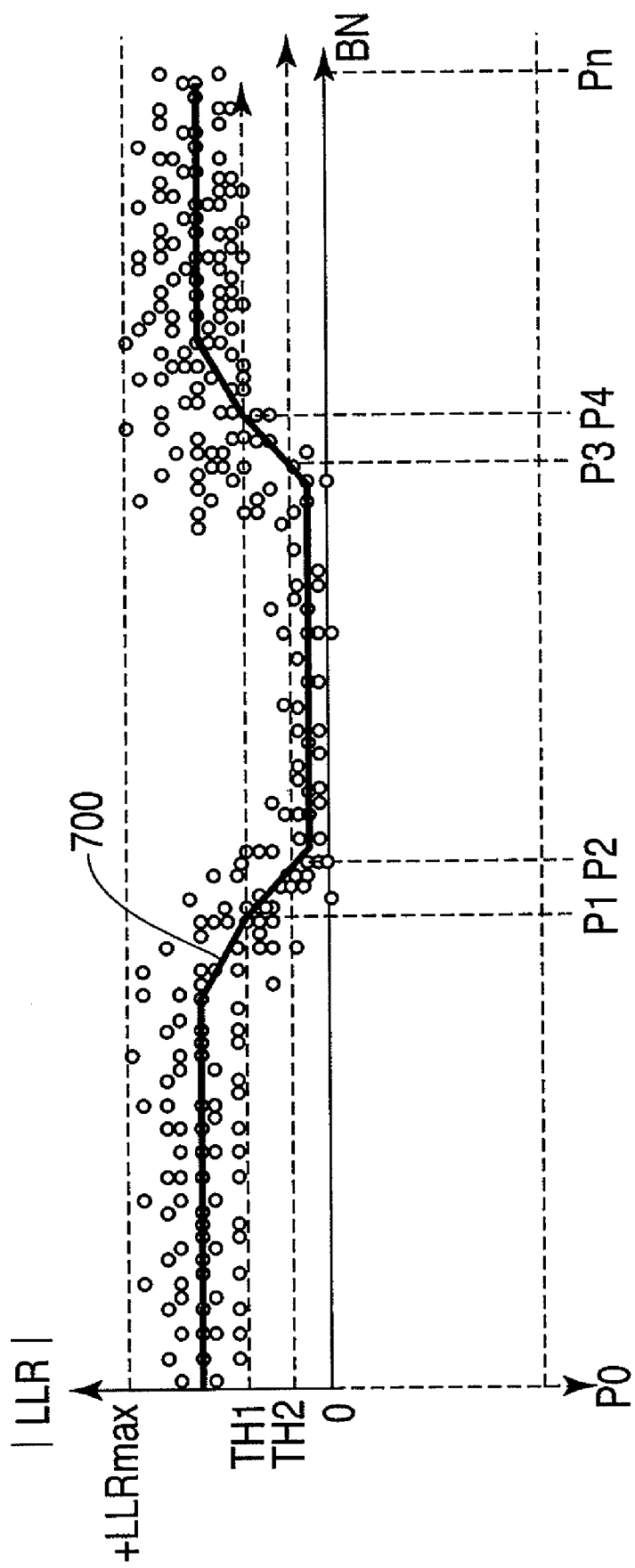
FIG. 7 is diagram showing an example of the distribution of the absolute values of log likelihood ratios corresponding to a data sector and the moving average of the absolute values of the log likelihood ratios.

Now, the procedure of window setting applied according to the embodiment will be described with reference to FIGS. 7 and 8. In this case, by way of example, windows are set by classifying the sequence of LLRs (the absolute values of LLRs) corresponding to the data sector into levels set by two thresholds TH1 and TH2 (TH1>TH2). Here, for simplification of description, it is assumed that three types of windows are set in association with three levels. FIG. 7 shows an example of the distribution of the absolute values (|LLR|) of LLRs corresponding to one data sector and a moving average line 700 for the absolute values of LLRs. FIG. 8 is a flowchart showing the procedure of window setting applied according to the embodiment.

First, it is assumed that the sequence of LLRs corresponding to the data sector and output first by the soft-decision most-likelihood decoder 18 in response to read of data from the data sector carried out by the head 12 is stored in the memory 210 in the LLR controller 21. The LLR controller 21 takes the absolute value (|LLR|) of each LLR in the sequence of LLRs (block 81). Then, based on the absolute value of each LLR, the LLR controller 21 calculates the moving average of the absolute values of LLRs (block 82). Specifically, the LLR controller 21 determines the average value of the absolute values of a certain number of LLRs preceding and succeeding the target LLR to be the absolute value of the target LLR. The LLR controller 21 iterates this operation on the absolute values of all LLRs corresponding to the data sector to calculate the moving average of absolute values of LLRs. In this manner, the moving average line 700 for the absolute values of LLRs shown in FIG. 7 is determined.

Then, based on the moving average line 700 and thresholds TH1 and TH2, the LLR controller 21 detects the range within which the value of the moving average line 700 is less than threshold TH1 and greater than threshold TH2, based on the rising portion and falling portion of the moving average line 700 (block 83). In the example in FIG. 7, the range between P1 and P2 is detected based on the falling portion of the moving average line 700. The range between P3 and P4 is detected based on the rising portion of the moving average line 700. In FIG. 7, P0 denotes the start point (leading bit) of the data sector. Pn denotes the end point (final bit) of the data sector.

Based on the bit positions of P1, P2, P3, and P4, the LLR controller 21 sets a window P0P1, a window P1P2, a window P2P3, a window P3P4, and a window P4Pn (block 84). The range of window P0P1 is between P0 and P1. The range of window P1P2 is between P1 and P2. The range of window P2P3 is between P2 and P3. The range of window P3P4 is between P3 and P4. The range of window P4Pn is between P4 and Pn. Window P2P3 corresponds to the defective portion. Windows P0P1 and P4Pn correspond to the normal portion. Windows P1P2 and P3P4 correspond to the boundary between the defective portion and the normal portion. Whether windows P1P2 and P3P4 are set to be the defective portion or the normal portion side may be selectively determined, for example, by the user.

In the above-described procedure of the window setting, it is assumed that the windows are set based on the level classifying for the sequence of LLRs corresponding to the data sector. However, the windows can also be set based on the level classifying for the amplitude (the absolute value of the amplitude) of the read signal corresponding to the data sector. In this case, the moving average of absolute value of the amplitude of the read signal may be used.

[Modification of Procedure of Window Setting]

Figure 9:
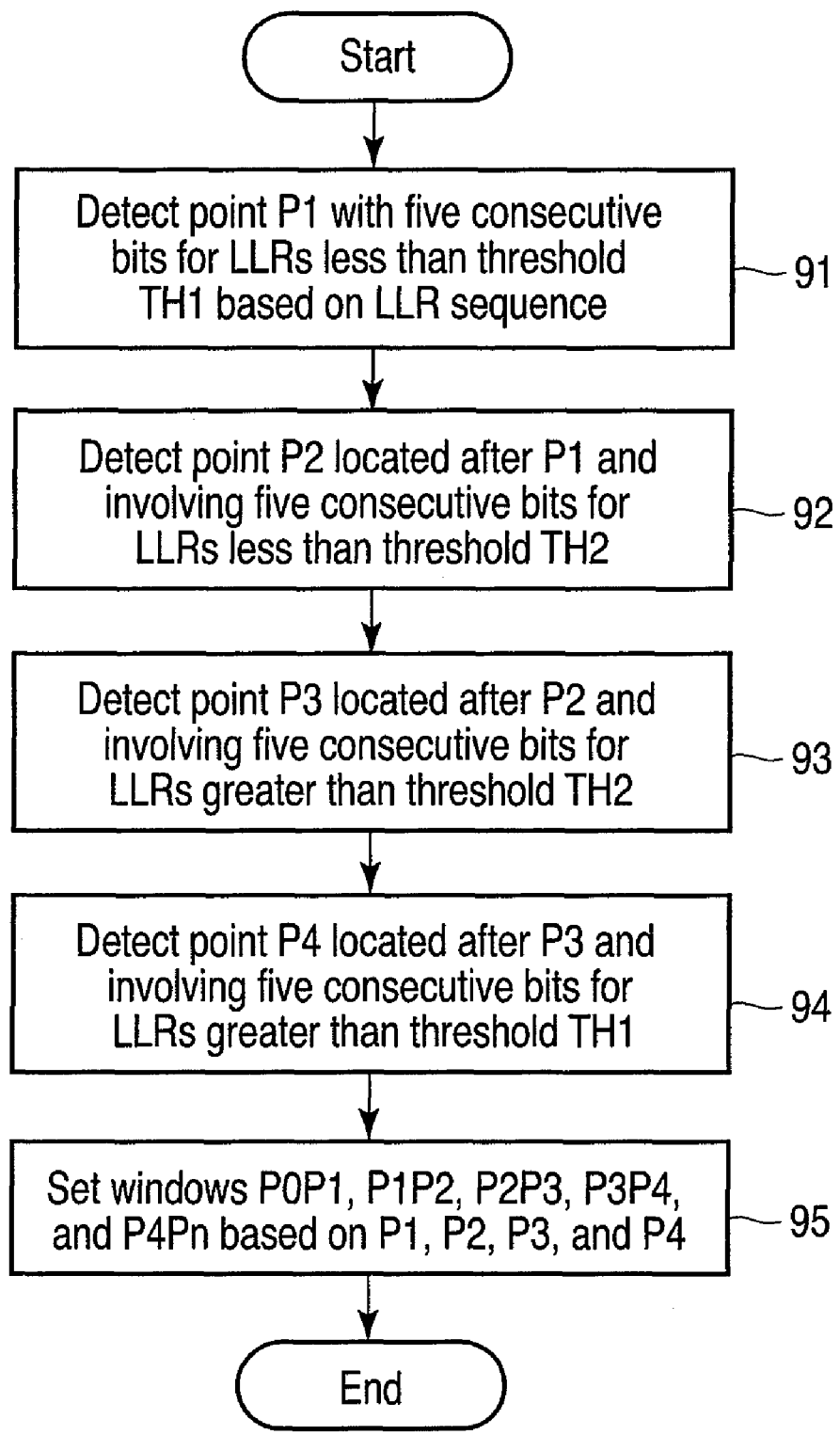
FIG. 9 is a flowchart showing a modification of the procedure of window setting.

Now, a modification of the procedure of window setting will be described with reference to the flowchart in FIG. 9. In the description below, to avoid complicatedness, the absolute values of LLRs are simply referred to as LLRs. The LLR controller 21 detects the point (bit position) P1 with a predetermined number of consecutive bits, for example, five consecutive bits, for LLRs less than threshold TH1 (block 91). Then, the controller 21 detects the point P2 which is located after P1 and which involves a predetermined number of consecutive bits, for example, five consecutive bits, for LLRs less than threshold TH2 (TH1>TH2) (block 92).

Then, the controller 21 detects the point P3 which is located after P2 and which involves a predetermined number of consecutive bits, for example, five consecutive bits, for LLRs greater than threshold TH2 (block 93). The controller 21 then detects the point P4 which is located after P3 and which involves a predetermined number of consecutive bits, for example, five consecutive bits, for LLRs greater than threshold TH1 (block 94). Based on the bit positions of P1, P2, P3, and P4, the LLR controller 21 sets window P0P1, window P1P2, window P2P3, window P3P4, and window P4Pn as is the case with block 84 described above (block 95).

The procedure of window setting applied to the above-described modification, it is assumed that the windows are set based on the level classifying for the sequence of LLRs corresponding to the data sector. However, the windows can also be set based on the level classifying for the amplitude of the read signal corresponding to the data sector.

Figure 10:
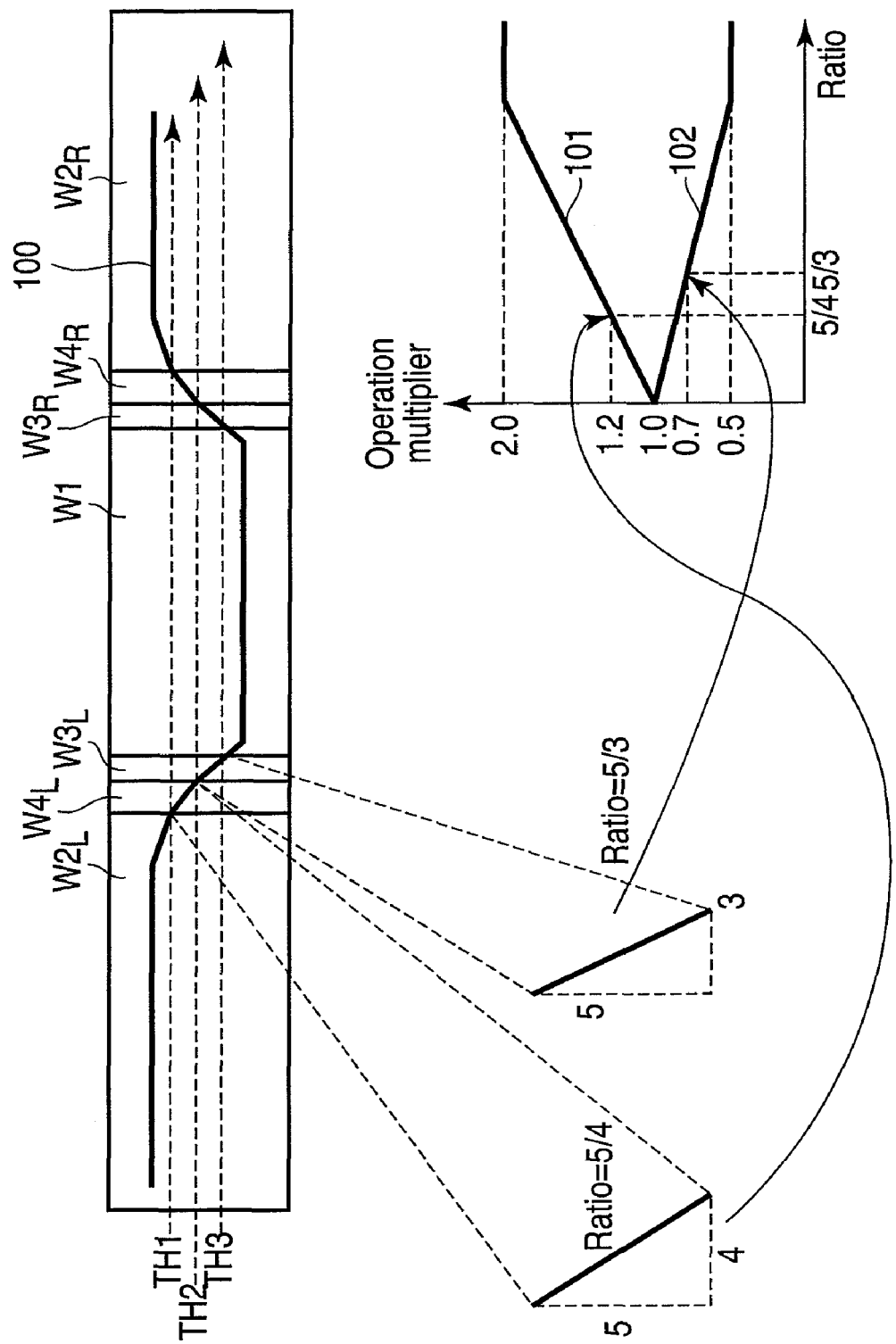
FIG. 10 is a diagram illustrating an exemplary method for determining an operation multiplier applied to each of windows after shipment of a magnetic disk drive according to the embodiment.

Now, a method for determining the operation multiplier applied to each window after shipment of HDD according to the embodiment will be described with reference to FIG. 10. In FIG. 10, reference number 100 denotes the moving average line of the absolute value of the amplitude of the read signal corresponding to one data sector or the moving average line of the absolute value of LLRs to one data sector. Based on the moving average line 100 and three thresholds TH1, TH2, and TH3 (TH1>TH2>TH3), the LLR controller 21 sets windows W1, $W2_L$, $W2_R$, $W3_L$, $W3_R$, $W4_L$, and $W4_R$ are set for the sequence of LLRs corresponding to the data sector as shown in FIG. 10.

Here, window W1 corresponding to the defective portion is a first window to which a predetermined operation multiplier (minimum multiplier or first multiplier), for example, 0.5, is applied. Windows $W2_L$ and $W2_R$ corresponding to the normal portion are second windows to which a predetermined operation multiplier (maximum multiplier or second multiplier), for example, 2.0, is applied.

In contrast, each of windows $W3_L$ and $W3_R$ corresponding to the defective portion side of the boundary between the defective portion and the normal portion is a third window to which an operation multiplier less than 1 and greater than or equal to 0.5 is applied. The operation multiplier applied to each of windows $W3_L$ and $W3_R$ is determined based on the inclination (more specifically, the absolute value of the inclination) of a segment of the moving average line 100 which is located in the window as well as a predetermined function 102. For example, when the width of window $W3_L$ is defined as w3, the inclination of the moving average line 100 in window $W3_L$ is approximated by the ratio of the difference between thresholds TH2 and TH3 to w3, that is, (TH2−TH3)/w3, and is 5/3 in the example in FIG. 10. If the function 102 is used, when the ratio is lower than a certain value, the operation multiplier decreases linearly with increasing ratio. Then, when the ratio exceeds the certain value, the operation multiplier is fixed to the minimum multiplier of 0.5.

Each of windows $W4_L$ and $W4_R$ corresponding to the normal portion side of the boundary between the defective portion and the normal portion is a fourth window to which an operation multiplier less than 1 and greater than or equal to 2.0 is applied. The operation multiplier applied to each of windows $W4_L$ and $W4_R$ is determined based on the inclination (more specifically, the absolute value of the inclination) of a segment of the moving average line 100 which is located in the window as well as a predetermined function 101. For example, when the width of window $W4_L$ is defined as w4, the inclination of the moving average line 100 in window $W4_L$ is approximated by the ratio of the difference between thresholds TH1 and TH2 to w4, that is, (TH1−TH2)/w4, and is 5/4 in the example in FIG. 10. If the function 101 is used, when the ratio is lower than a certain value, the operation multiplier increases linearly with the ratio. Then, when the ratio exceeds the certain value, the operation multiplier is fixed to the maximum multiplier of 2.0.

Figure 11:
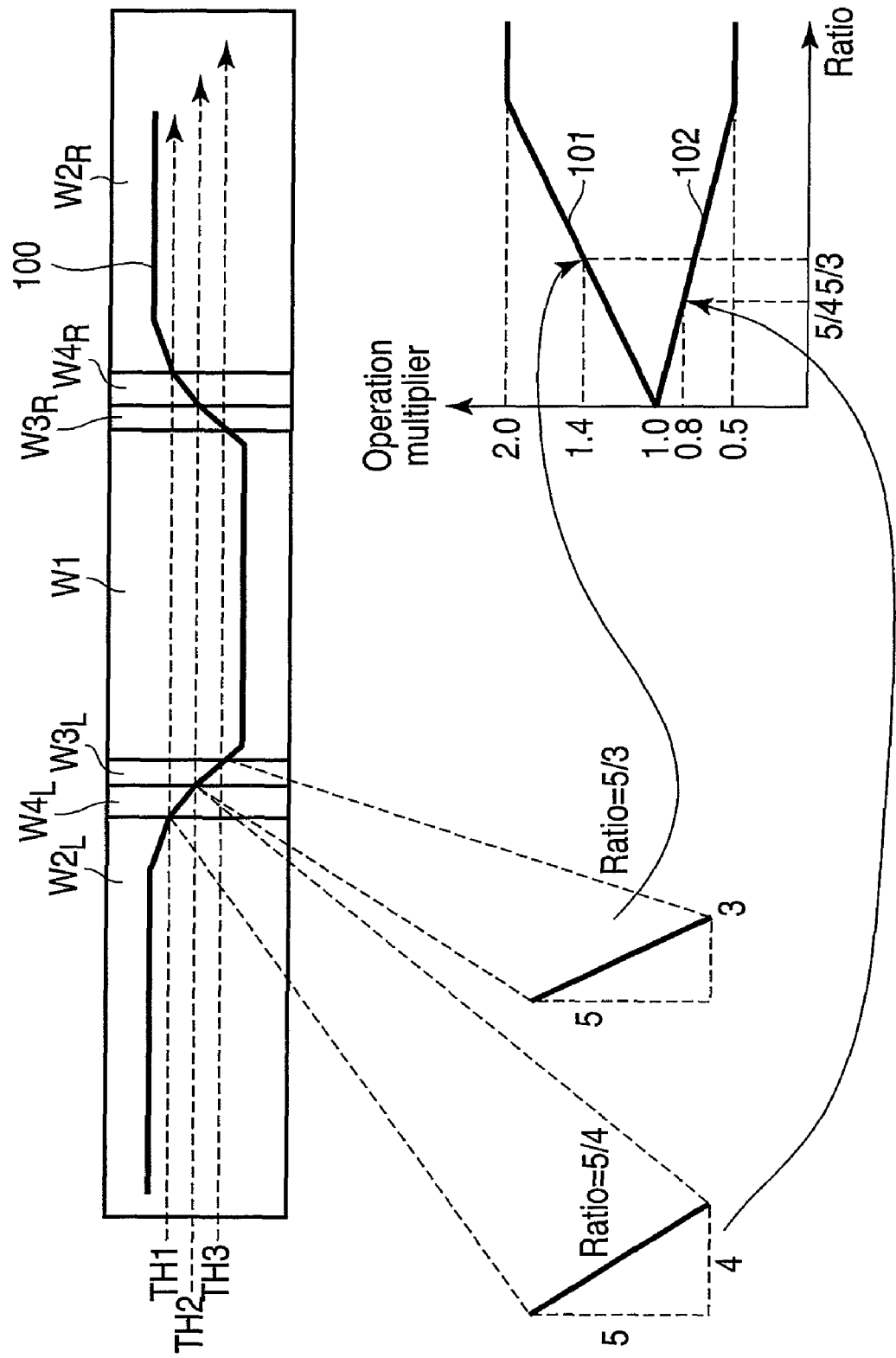
FIG. 11 is a diagram illustrating an exemplary method for determining an operation multiplier applied to each of windows during the manufacturing process for the magnetic disk drive according to the embodiment.

Now, the method for determining the operation multiplier applied to each window during the process of manufacturing HDD will be described with reference to FIG. 11. In FIG. 11, components equivalent to those in FIG. 10 are denoted by the same reference numbers or characters. In FIG. 11, window W1 is a first window to which a predetermined operation multiplier (maximum multiplier or first multiplier), for example, 2.0, is applied. Each of windows $W2_L$ and $W2_R$ is a second window to which a predetermined operation multiplier (minimum multiplier or second multiplier), for example, 0.5, is applied.

In contrast, each of windows $W3_L$ and $W3_R$ is a third window to which an operation multiplier greater than 1 and less than or equal to 2.0 is applied. The operation multiplier applied to each of windows $W3_L$ and $W3_R$ is determined based on the inclination of a segment of the moving average line 100 which is located in the window as well as the predetermined function 101. For example, the inclination of the moving average line 100 in window $W3_L$ is approximated by the ratio (TH2−TH3)/w3 as described above, and is 5/3 in the example in FIG. 11. If the function 101 is used, when the ratio is lower than a certain value, the operation multiplier increases linearly with the ratio. Then, when the ratio exceeds the certain value, the operation multiplier is fixed to the maximum multiplier of 2.0.

Each of windows $W4_L$ and $W4_R$ is a fourth window to which an operation multiplier less than 1 and greater than or equal to 0.5 is applied. The operation multiplier applied to each of windows $W4_L$ and $W4_R$ is determined based on the inclination of a segment of the moving average line 100 which is located in the window as well as the predetermined function 102. For example, when the width of window $W4_L$ is defined as w4, the inclination of the moving average line 100 in window $W4_L$ is approximated by the ratio (TH1−TH2)/w4 as described above, and is 5/4 in the example in FIG. 11. If the function 102 is used, when the ratio is lower than a certain value, the operation multiplier decreases linearly with increasing ratio. Then, when the ratio exceeds the certain value, the operation multiplier is fixed to the minimum multiplier of 0.5.

In the example in FIG. 11, the moving average line 100 includes a section in which the value is less than threshold TH3. Window W1 is set in association with this section. However, if the value of the moving average line 100 exceeds threshold TH3, window W1 is not set. The defect detector 20 detects that no defective portion is present on the corresponding data sector. If no defective portion is detected on the data sector during the process of manufacturing HDD, then in the embodiment, the LLR operation mode is not set for the data sector. However, in response to the user's instruction, the LLR operation mode may be set depending on whether or not the moving average line 100 includes a section in which the value is less than threshold TH1 or TH2.

In the embodiment, the LDPC code is applied as a parity check code. However, a single parity check code, a turbo code, or the like can be applied as a parity check code. Furthermore, in the embodiment, it is assumed that the disk apparatus is HDD (magnetic disk drive). However, disk apparatuses other than HDD such as magneto-optical disk drives may be used provided that iterative decoding is applied to the disk apparatus.

The various modules of the systems described herein can be implemented as software applications, hardware and/or software modules, or components on one or more computers, such as servers. While the various modules are illustrated separately, they may share some or all of the same underlying logic or code.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method for operating log likelihood ratios output by a soft-decision most-likelihood decoder in a disk apparatus to which iterative decoding is applied, the method comprising:
    setting a first window and a second window for a sequence of the log likelihood ratios output by the soft-decision most-likelihood decoder based on the sequence of the log likelihood ratios or an amplitude of a read signal acquired by a head configured to read data from a data sector on a disk, wherein the first window corresponds to a defective portion on the data sector and the second window corresponds to a normal portion on the data sector;
    multiplying the log likelihood ratios in the first window by a first multiplier and multiplying the log likelihood ratios in the second window by a second multiplier if the defective portion on the data sector is detected, wherein the first multiplier is greater than 1 and the second multiplier is less than 1; and transmitting the sequence of the multiplied log likelihood ratios to a parity check decoder.

2. The method of claim 1, wherein the first and second windows are set based on the amplitude or the log likelihood ratios and at least one predetermined threshold.

3. The method of claim 2, further comprising multiplying the log likelihood ratios in the first window by a third multiplier and multiplying the log likelihood ratios in the second window by a fourth multiplier if data is read from the data sector having the defective portion, wherein the third multiplier is less than 1 and the fourth multiplier is greater than 1.

4. The method of claim 1, further comprising:

setting a third window and a fourth window corresponding to a boundary portion between the defective portion and the normal portion, the third window being set closer to the first window, and the fourth window being set closer to the second window; and multiplying the log likelihood ratios in the third window by a third multiplier and multiplying the log likelihood ratios in the fourth window by a fourth multiplier if the defective portion on the data sector is detected, wherein the third multiplier is greater than 1 and the fourth multiplier is less than 1.

5. A disk apparatus comprising:

a soft-decision most-likelihood decoder configured to output a sequence of log likelihood ratios from a bit sequence corresponding to data read from a data sector on a disk by a head, a parity check code added to the read data;

a parity check decoder configured to decode data corresponding to the sequence of the log likelihood ratios and to iterate an operation of updating the sequence of the log likelihood ratios based on the parity check code added to the data and transmitting the updated sequence of the log likelihood ratios to the soft-decision most-likelihood decoder, in order to decode the data;

a defect detector configured to set a first window and a second window for the sequence of the log likelihood ratios output by the soft-decision most-likelihood decoder based on an amplitude of a read signal acquired in response to the read carried out by the head or the sequence of the log likelihood ratios, wherein the first window corresponds to a defective portion on the data sector and the second window corresponds to a normal portion on the data sector; and a log likelihood ratio controller configured to multiply the log likelihood ratios in the first window by a first multiplier and to multiply the log likelihood ratios in the second window by a second multiplier if the defective portion on the data sector is detected and to transmit the multiplied log likelihood ratios to the parity check decoder, wherein the first multiplier is greater than 1 and the second multiplier is less than 1.

6. The disk apparatus of claim 5, wherein the defect detector is configured to set the first and second windows based on the amplitude or the log likelihood ratios and at least one predetermined threshold.

7. The disk apparatus of claim 6, wherein the log likelihood ratio controller is configured to multiply the log likelihood ratios in the first window by a third multiplier and to multiply the log likelihood ratios in the second window by a fourth multiplier if data is read from the data sector having the defective portion, wherein the third multiplier is less than 1 and the fourth multiplier is greater than 1.

8. The disk apparatus of claim 5, wherein:

the defect detector is configured to set a third window and a fourth window corresponding to a boundary portion between the defective portion and the normal portion, the third window being set closer to the first window, and the fourth window being set closer to the second window; and the log likelihood ratio controller is configured to multiply the log likelihood ratios in the third window by a third multiplier and to multiply the log likelihood ratios in the fourth window by a fourth multiplier if the defective portion on the data sector is detected, wherein the third multiplier is greater than 1 and the fourth multiplier is less than 1.

9. The disk apparatus of claim 5, wherein the log likelihood ratio controller is configured to multiply the log likelihood ratios in the first window by a third multiplier and to multiply the log likelihood ratios in the second window by a fourth multiplier if data is read from the data sector having the defective portion, wherein the third multiplier is less than 1 and the fourth multiplier is greater than 1.

10. The method of claim 1, further comprising multiplying the log likelihood ratios in the first window by a third multiplier and multiplying the log likelihood ratios in the second window by a fourth multiplier if data is read from the data sector having the defective portion, wherein the third multiplier is less than 1 and the fourth multiplier is greater than 1.

\* \* \* \* \*